(12) United States Patent
Chang

(10) Patent No.: US 6,916,713 B2
(45) Date of Patent: Jul. 12, 2005

(54) CODE IMPLANTATION PROCESS

(75) Inventor: Ching-Yu Chang, Yilan Hsien (TW)

(73) Assignee: Macronix International Co., Ltd., Hsinchu (TW)

( * ) Notice: Subject to any disclaimer, the term of this patent is extended or adjusted under 35 U.S.C. 154(b) by 287 days.

(21) Appl. No.: 10/065,646

(22) Filed: Nov. 5, 2002

(65) Prior Publication Data
US 2004/0087161 A1 May 6, 2004

(51) Int. Cl.$^7$ .................. H01L 21/8234; H01L 29/76
(52) U.S. Cl. .................. 438/275; 438/276; 438/690; 257/314; 257/318; 257/347; 257/390
(58) Field of Search .................. 438/72, 201, 211, 438/275, 260–264, 276, 736, 690–693; 257/204, 306, 314–324, 347, 390

(56) References Cited

U.S. PATENT DOCUMENTS 5,498,565 A * 3/1996 Gocho et al. .............. 438/427
6,355,524 B1 * 3/2002 Tuan et al. ................. 438/257
6,580,120 B2 * 6/2003 Haspeslagh ................ 257/315
6,587,387 B1 * 7/2003 Fan et al. ................... 365/201
2003/0030074 A1 * 2/2003 Walker et al. .............. 257/204

* cited by examiner

Primary Examiner—Duy-Vu N. Deo
(74) Attorney, Agent, or Firm—J.C. Patents

(57) ABSTRACT

The present invention provides a code implantation process for the mask read only memory (MROM). A gate oxide layer and a wordline are formed sequentially over a substrate having a buried bitline, with a cap layer formed on the top of the wordline. A dielectric layer is formed on the substrate that is not covered by the wordline and the cap layer. A resist layer with a line/space pattern is formed on the dielectric layer and the cap layer, while the line/space pattern has a first extending direction different to a second extending direction of the cap layer. After removing the cap layer not covered by the resist layer, a code mask layer is formed over the substrate. An ion implantation step is performed to implant dopants into a predetermined code channel region by using the code mask layer, the dielectric layer and the remained cap layer as a mask.

23 Claims, 7 Drawing Sheets

CODE IMPLANTATION PROCESS

BACKGROUND OF INVENTION

1. Field of Invention

The present invention relates to a code implantation process of a mask read only memory (MROM). More particularly, the present invention relates to a self-aligned code implantation process of a mask read only memory (MROM).

2. Description of Related Art

In general, the mask read only memory (MROM) structure includes a plurality of bitlines and a plurality of polysilicon wordlines bridging over the bitlines. Channel regions of the memory cells are beneath the wordlines and between two neighboring bitlines. The MROM cells can be programmed to store two-bit data. For the MROM cell programming, the stored data is either "0" or "1" depending on whether the dopant ions are implanted into the channel regions or not. Such implantation process, implanting dopants into the specific channel regions, is so called code implantation process.

Ordinarily, the code implantation process of the MROM includes the following steps. Using a photomask, the resist layer over the substrate is patterned to expose the channel regions that are to be coded. Next, using the patterned resist layer as a mask, an ion implantation process is performed to dope ions into the predetermined channel regions. However, the patterned resist layer (code mask layer) usually includes an isolated pattern region and a dense pattern region. During the exposure step, the dense pattern region can easily have erroneous critical dimensions (CDs) due to the optical proximity effect. Therefore, misalignment can occur if the patterned resist layer with erroneous CDs is used as a mask for code implantation, leading to faulty data storage in the memory cells. As a result, it deteriorates the operation and reliability of the memory device.

In the prior art optical proximity correction (OPC) or/and phase shift mask technologies are usually applied for helping control the critical dimensions of the openings in the dense pattern region. For OPC, it is required to design special patterns in the masks to correct the erroneous CDs resulting from optical proximity effect, which is very time-consuming and thus increase the costs. Moreover, it is very difficult to debug the defeats in the mask patterns.

Furthermore, if the 248 nm-exposure system is applied in the photolithography process, the exposure resolution has a limitation of about 0.16–0.18 critical dimensions. In order to improve the exposure resolution, light of a wavelength at 198 nm is needed for the lithography process. However, not only the exposure system of 198 nm is high-priced but the compatible photoresist materials are also more expensive.

In addition, misalignment resulting from erroneous CDs of the code mask layer can cause out-diffusion of the doped ions (code ions) in the channel regions. The code ions implanted by the code implantation may diffuse into the buried bitlines, thus changing the dopant concentrations and the current of the buried bitlines.

SUMMARY OF INVENTION

The present invention provides a code implantation process for the mask read only memory (MROM), which can prevent problems arising from misalignment or erroneous critical dimensions of the code mask layer, without using optical proximity correction (OPC) technology or/and phase shift mask technology.

The present invention provides a code implantation process for the mask read only memory (MROM), which can avoids faulty data storage resulting from misalignment.

The present invention provides a code implantation process for the mask read only memory (MROM), which can avoid out-diffusion of the dopants into the buried bitline and thus enhance performance of the memory.

As embodied and broadly described herein, the invention provides a code implantation process for the mask read only memory (MROM), comprising: forming a buried bitline in a substrate; forming a gate oxide layer on a surface of the substrate; sequentially forming a polysilicon layer and a material layer on the gate oxide layer; patterning the polysilicon layer and the material layer in a direction perpendicular to the buried bitline, to form a wordline and a cap layer on the top of the wordline; forming a dielectric layer over the substrate to cover the cap layer; removing a portion of the dielectric layer until the cap layer is exposed; forming a resist layer with a line/space pattern on the dielectric layer and the cap layer, wherein the line/space pattern has a first extending direction different to a second extending direction of the cap layer; removing the cap layer not covered by the resist layer to form an opening that exposes the wordline above a channel region; forming a code mask layer over the substrate; and performing an ion implantation step to implant dopants into a predetermined code channel region by using the code mask layer, the dielectric layer and the remained cap layer as a mask.

As embodied and broadly described herein, the invention provides a code implantation process for the mask read only memory (MROM), comprising: forming a buried bitline in a substrate; forming a gate oxide layer on a surface of the substrate; sequentially forming a polysilicon layer, an etching stop layer and a material layer on the gate oxide layer; patterning the polysilicon layer, the etching stop layer and the material layer in a direction perpendicular to the buried bitline, to form a wordline, a stop layer and a cap layer on the top of the wordline; forming a dielectric layer over the substrate to cover the cap layer; removing a portion of the dielectric layer until the cap layer is exposed; forming a resist layer with a line/space pattern on the dielectric layer and the cap layer, wherein the line/space pattern has a first extending direction different to a second extending direction of the cap layer; removing the cap layer not covered by the resist layer to form an opening that exposes the stop layer and corresponds to an underlying channel region; forming a code mask layer over the substrate; and performing an ion implantation step to implant dopants into a predetermined code channel region by using the code mask layer, the dielectric layer and the remained cap layer as a mask.

In the present invention, since the dielectric layer and the cap layer do not cover the channel regions of the memory cells, the subsequent code implantation process can implant ions into the channel regions in a self-aligned mode.

In the prior art, optical proximity correction (OPC) or/and phase shift mask technologies are usually applied for helping control the critical dimensions of the densely arranged openings. However, with the help of the dielectric layer and the cap layer beneath the openings, such time-consuming and expensive processes are not required for further improving resolution. As a result, simply the ordinary exposure system, such as, a 248 nm-exposure system, is used in the code implantation process of the present invention for the MROM, thus reducing the costs.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

FIGS. 1A to 1D are cross-sectional views of the code implantation process for a mask read only memory (MROM) according to one preferred embodiment of this invention.

Figure 1A:
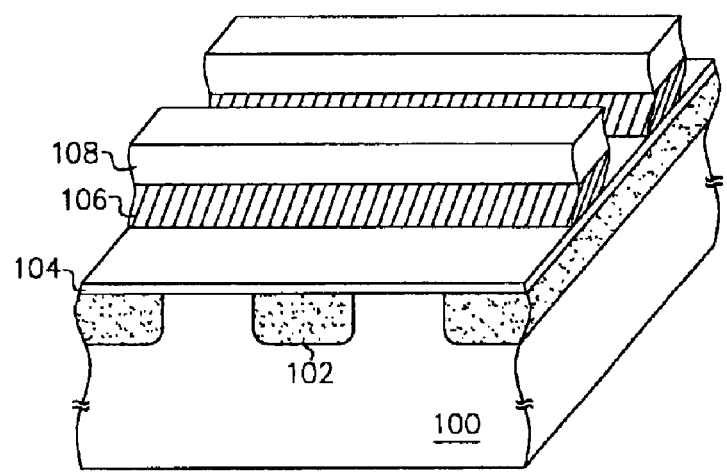
FIGS. 1A to 1D are cross-sectional views of the code implantation process for a mask read only memory (MROM) according to one preferred embodiment of this invention.

Referring to FIG. 1A, a plurality of buried bitlines 102 is formed in a substrate 100. A gate oxide layer 104 is formed on a surface of the substrate 100 by, for example, thermal oxidation. A plurality of wordlines 106 is formed on the gate oxide layer 104 and a cap layer 108 is formed on a top of the wordlines 106.

For example, a conductive layer (not shown) is globally formed on the gate oxide layer 104 and a material layer (not shown) is formed on the conductive layer. The conductive layer and the material layer are then patterned in a direction perpendicular to the buried bitlines, in order to form the wordlines 106 and the cap layer 108. That is, the wordlines 106 and the cap layer 108, now in strip-like shapes, have an extending direction I perpendicular to the buried bitlines. It is noted that the wordline and the cap layer have an etching selectivity. According to the preferred embodiment of the present invention, the material for forming the wordline 106 is, for example, polysilicon, while the material for forming the cap layer 108 is, for example, silicon oxide, silicon nitride or silicon oxynitride.

Figure 1B:
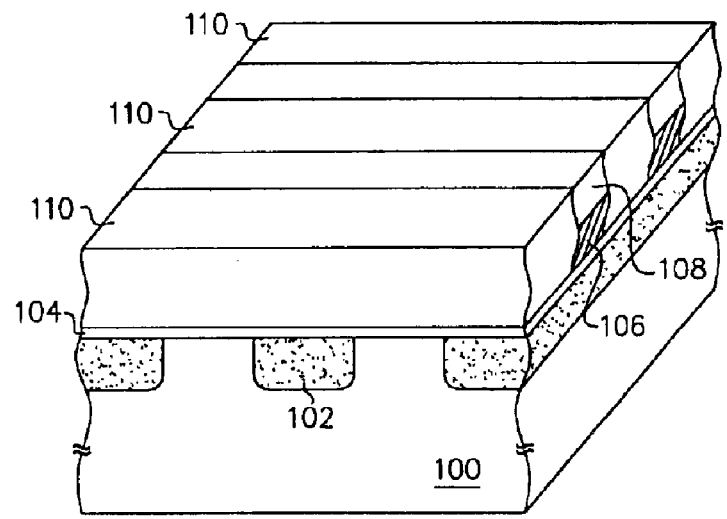

Referring to FIG. 1B, a dielectric layer 110 is formed on the substrate that is not covered by the wordline 106 and the cap layer 108, i.e. the dielectric layer 110 fills up the spaces between the wordlines 106. The method for forming dielectric layer 110 includes forming a blanket dielectric layer (not shown) over the substrate 110 to cover the cap layer 108, and performing a CMP process or etching back to remove a portion of the blanket dielectric layer until the cap layer is exposed, for example.

It is noted that the dielectric layer 110 and the cap layer 108 have an etching selectivity. According to the preferred embodiment of the present invention, if the material for forming the cap layer 108 is, for example, silicon oxide, the material for forming the dielectric layer 110 is, for example, silicon nitride or silicon oxynitride. If the material for forming the cap layer 108 is, for example, silicon nitride or silicon oxynitride, the material for forming the dielectric layer 110 is, for example, silicon oxide.

Figure 1C:
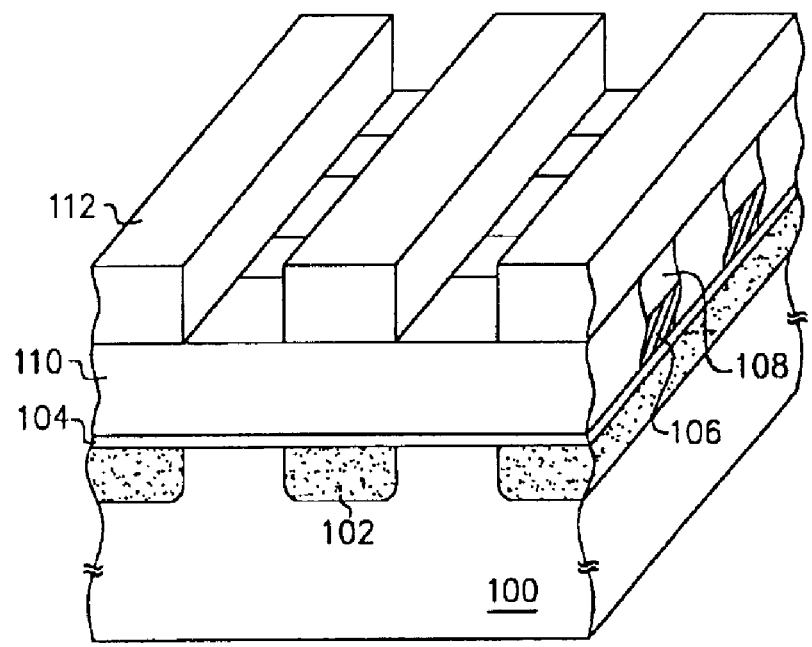
Figure 1D:
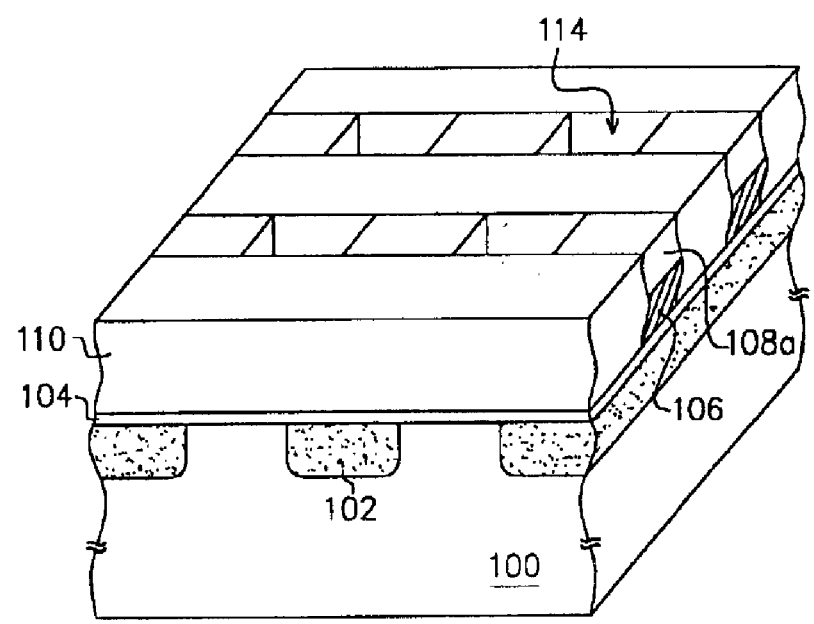

Referring to FIGS. 1C and 1D, a resist layer 112 with a line/space pattern is formed on the dielectric layer 110 and the cap layer 108. The line/space pattern of the resist layer 112 has a line-extending direction II perpendicular to the cap layer 108. Alternatively, the line-extending direction II of the line/space pattern in the resist layer 112 is different to the extending direction I of the cap layer 108.

Afterwards, openings 114 are formed (as shown in FIG. 1D) by removing the cap layer 108 that is not covered by the resist layer 112. The openings 114 expose a portion of the wordlines 106 that are located above channel regions of the memory cells. Because the dielectric layer 110 and the cap layer 108 have an etching selectivity, the exposed dielectric layer 110 is not removed during the formation of the openings 114. Moreover, since the wordline 106 and the cap layer 108 have an etching selectivity, the etching process for forming the openings 114 will stop at the wordlines 106.

Figure 2:
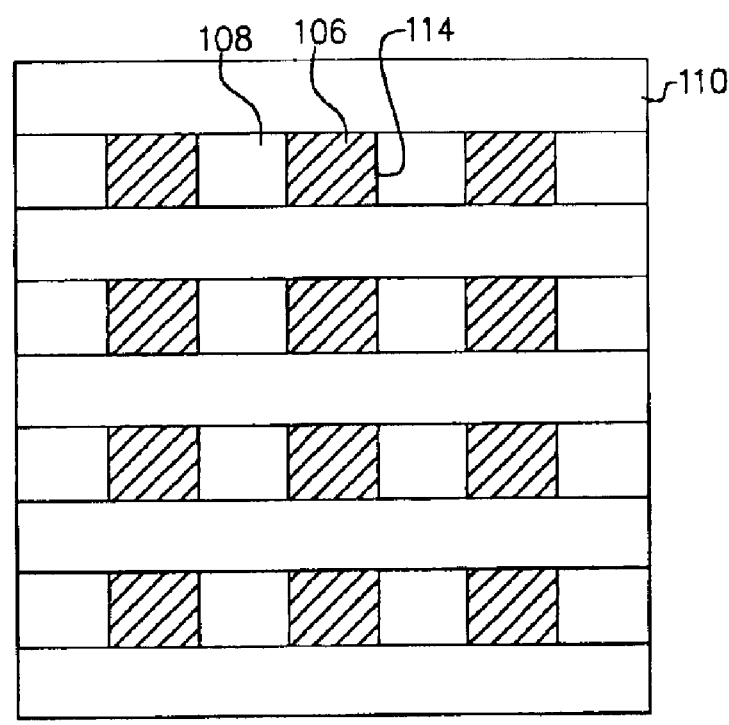
FIG. 2 is a schematic top view of FIG. 1D.

As shown in FIG. 2, the openings 114 are encircled by the dielectric layer 110 and the remained cap layer 108a, corresponding to the underneath channel regions of the memory cells.

Figure 3:
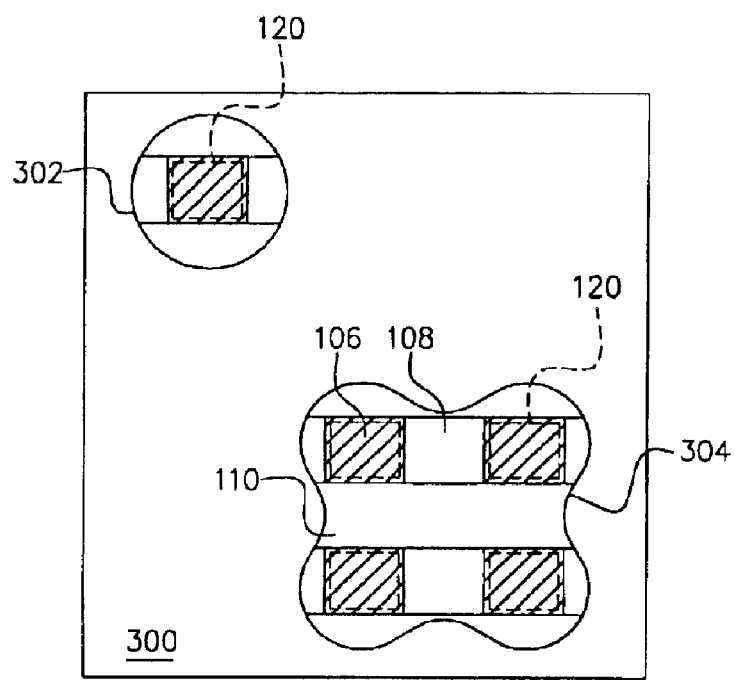
FIG. 3 is a top view of a code mask layer of the memory device according to one preferred embodiment of this invention.

FIG. 3 is a top view of a code mask layer of the memory device according to one preferred embodiment of this invention. Referring to FIG. 3 and FIG. 1D, after removing the resist layer 112, a code mask layer 300 (shown in FIG. 3) is formed over the substrate 100. In the code mask layer 300, there are first openings 302 arranged loosely in one region and second openings 304 densely arranged in another region. The first and second openings can expose the underlying layers, including the wordlines 106, the dielectric layer 110 and the cap layer 108a. Due to the optical proximity effect, it is difficult to control the critical dimensions (CDs) of the densely arranged second openings 304. If the critical dimensions of the second openings are small and misalignment occurs, the densely arranged second openings may not be resolved, thus even leading to forming overextending openings.

Fortunately, the dielectric layer 110 and the cap layer 108a underlying the second openings 304 can mitigate the above problems. As shown in FIG. 3, the dielectric layer 110 in combination of the remained cap layer 108a only expose predetermined portions of the wordlines 106 above the channel regions of the memory cells, but protects the other portions of the wordlines 106 from unexpected exposure by erroneously formed overextending openings. In this way, only the predetermined portions of the wordlines are exposed and the underlying channel regions 120 are to be coded in the following code implantation process.

By using the code mask layer 300, the dielectric layer 110 and the cap layer 108a as a implantation mask, an ion implantation process (a code implantation process) is performed to dope ions into the predetermined channel regions 120.

FIGS. 4A–4D are cross-sectional views of the code implantation process for a mask read only memory (MROM) according to another preferred embodiment of this invention.

Figure 4A:
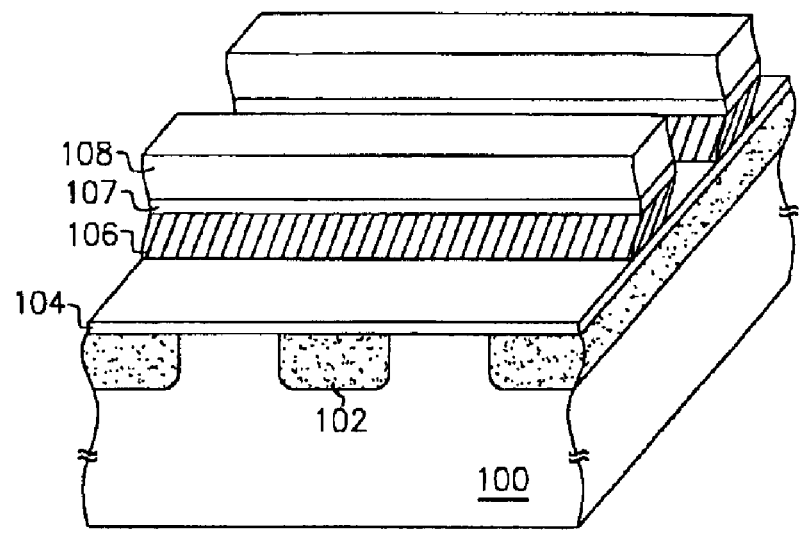
FIGS. 4A–4D are cross-sectional views of the code implantation process for a mask read only memory (MROM) according to another preferred embodiment of this invention.

Referring to FIG. 4A, a plurality of buried bitlines 102 is formed in a substrate 100. A gate oxide layer 104 is formed on a surface of the substrate 100 by, for example, thermal oxidation. A plurality of wordlines 106 is formed on the gate oxide layer 104 and a cap layer 108 is formed on a top of the wordlines 106. Moreover, a stop layer 107 is formed between the wordlines 106 and the cap layer 108.

For example, a conductive layer (not shown) is globally formed on the gate oxide layer 104. An etching stop layer (not shown) is formed on the conductive layer and a material layer (not shown) is formed on the etching stop layer. The conductive layer, the etching stop layer and the material layer are then patterned in a direction perpendicular to the buried bitlines, in order to form the wordlines 106, the stop layer 107 and the cap layer 108. That is, the wordlines 106, the stop layer 107 and the cap layer 108, now in strip-like shapes, have an extending direction I perpendicular to the buried bitlines.

It is noted that the stop layer 107 and the cap layer 108 have an etching selectivity. According to the preferred embodiment of the present invention, if the material for forming the wordline 106 is polysilicon, the material for forming the cap layer 108 can be polysilicon because the stop layer 107 is arranged between the wordline and the cap layer. Alternatively, the material for forming the cap layer 108 can be different to that of the wordline 106. The material of the stop layer 107 is, for example, silicon oxide, silicon nitride or silicon oxynitride.

Figure 4B:
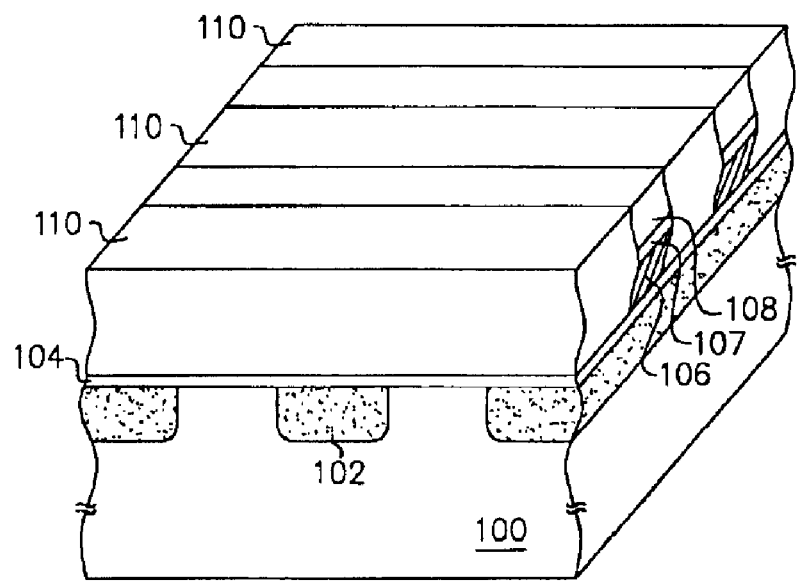

Referring to FIG. 4B, a dielectric layer 110 is formed on the substrate that is not covered by the wordline 106, the stop layer 107 and the cap layer 108, i.e. the dielectric layer 110 fills up the spaces between the wordlines 106. The method for forming dielectric layer 110 includes forming a blanket dielectric layer (not shown) over the substrate 110 to cover the cap layer 108, and performing a CMP process or etching back to remove a portion of the blanket dielectric layer until the cap layer is exposed, for example.

It is noted that the dielectric layer 110 and the cap layer 108 have an etching selectivity. According to the preferred embodiment of the present invention, if the material for forming the cap layer 108 is polysilicon, the material for forming the dielectric layer 110 is, for example, silicon nitride or silicon oxynitride and the material for forming the stop layer 107 is silicon oxide. If the material for forming the cap layer 108 is polysilicon, the material for forming the dielectric layer 110 is silicon oxide and the material for forming the stop layer 107 is, for example, silicon nitride silicon oxynitride.

Figure 4C:
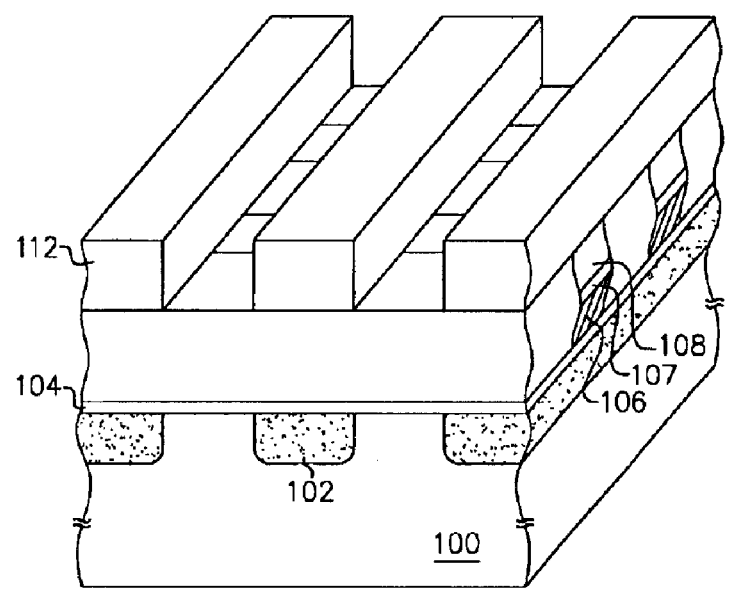
Figure 4D:
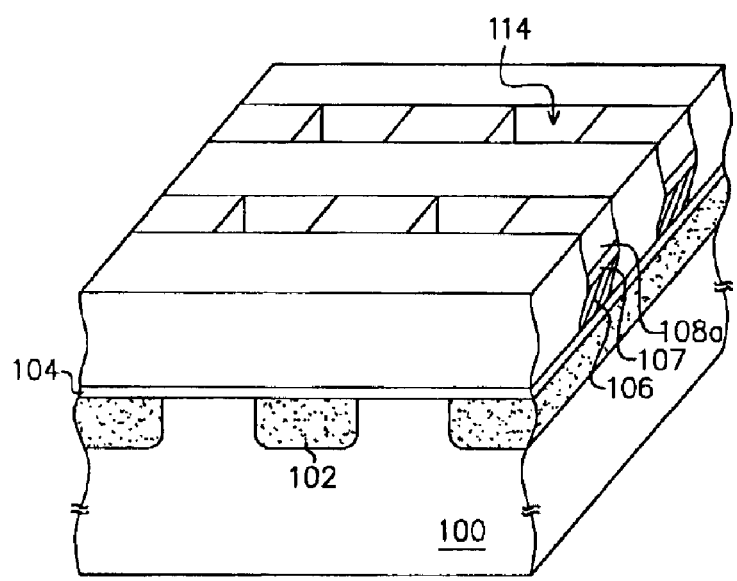

Referring to FIGS. 4C and 4D, a resist layer 112 with a line/space pattern is formed on the dielectric layer 110 and the cap layer 108. The line/space pattern of the resist layer 112 has a line-extending direction II perpendicular to the cap layer 108. Alternatively, the line-extending direction II of the line/space pattern in the resist layer 112 is different to the extending direction I of the cap layer 108.

Afterwards, openings 114 are formed (as shown in FIG. 1D) by removing the cap layer 108 that is not covered by the resist layer 112. The openings 114 expose a portion of the stop layer 107 above the wordlines 106, while the openings 114 corresponds to underlying channel regions (not shown) of the memory cells. Because the dielectric layer 110 and the cap layer 108 have an etching selectivity, the exposed dielectric layer 110 is not removed during the formation of the openings 114. Moreover, since the stop layer 107 and the cap layer 108 have an etching selectivity, the etching process for forming the openings 114 will stop at the stop layer 107.

Referring to FIG. 3 and FIG. 4D, after removing the resist layer 112, a code mask layer 300 (shown in FIG. 3) is formed over the substrate 100. In the code mask layer 300, there are first openings 302 arranged loosely in one region and second openings 304 densely arranged in another region. The first and second openings can expose the underlying layers, including the wordlines 106, the dielectric layer 110 and the cap layer 108*a*. Due to the optical proximity effect, it is difficult to control the critical dimensions (CDs) of the densely arranged second openings 304. If the critical dimensions of the second openings are larger than ideal size and merge to each other, or misalignment occurs, the densely arranged second openings may leading to overextending openings.

Fortunately, the dielectric layer 110 and the cap layer 108*a* underlying the second openings 304 can mitigate the above problems. As shown in FIG. 3, the dielectric layer 110 in combination of the remained cap layer 108*a* only expose predetermined portions of the wordlines 106 above the channel regions of the memory cells, but protects the other portions of the wordlines 106 from unexpected exposure by erroneously formed overextending openings. In this way, only the predetermined portions of the wordlines are exposed and the underlying channel regions 120 are to be coded in the following code implantation process. Not only for MROM, the present invention can be applied on other memory devices, such as FPGA.

As the line width of later semiconductor process has been greatly reduced, this invention also provides a simple and reliable method for forming contact holes. Contact holes are defined by using least two sets of line-space patterns that intersect each other, and a selective development step. Since no complicated patterns are involved, problems accompanying a conventional contact-forming process such as proximity effects and cost of complicated mask are effectively reduced. It should be appreciated that variations of the invention may exist in different applications. For example, a wordline may not be necessary for forming contact holes, or some other materials may be selected in place of the wordlines.

By using the code mask layer 300, the dielectric layer 110 and the cap layer 108*a* as a implantation mask, an ion implantation process (a code implantation process) is performed to dope ions into the predetermined channel regions 120.

In conclusion, the present invention has the following advantages:

1. In the present invention, since the dielectric layer and the cap layer do not cover the channel regions of the memory cells, the subsequent code implantation process can implant ions into the channel regions in a self-aligned mode.

2. In the prior art, optical proximity correction (OPC) or/and phase shift mask technologies are usually applied for helping control the critical dimensions of the densely arranged openings. However, with the help of the dielectric layer and the cap layer beneath the openings, such time-consuming and expensive processes are not required for further improving resolution. As a result, simply the ordinary exposure system, such as, a 248 nm-exposure system, is used in the code implantation process of the present invention for the MROM, thus reducing the costs.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A code implantation process comprising:
   forming a gate oxide layer on a surface of the substrate;
   forming a plurality of conductive lines running in a first direction on the gate oxide layer, wherein the conductive lines are covered by a cap layer;
   forming a dielectric layer over the substrate to cover the cap layer;

removing a portion of the dielectric layer until the cap layer is exposed;

forming a resist layer with a line/space pattern on the dielectric layer and the cap layer, wherein the line/space pattern extending in a second direction different from the first direction;

removing the cap layer not covered by the resist layer; and performing an ion implantation step to implant dopants into a region not covered by the cap layer.

2. The process of claim 1, wherein the conductive lines and the cap layer have an etching selectivity.

3. The process of claim 1, wherein the dielectric layer and the cap layer has an etching selectivity.

4. The process of claim 1, wherein a material for forming the conductive lines includes polysilicon.

5. The process of claim 1, wherein a material for forming the cap layer includes silicon oxide, while a material for forming the dielectric layer is silicon nitride or silicon oxynitride.

6. The process of claim 1, wherein a material for forming the dielectric layer includes silicon oxide, while a material for forming the cap layer is silicon nitride or silicon oxynitride.

7. The process of claim 1, wherein the first direction is perpendicular to the second direction.

8. The process of claim 1, wherein a method for removing a portion of the dielectric layer until the cap layer being exposed is an etching back process or a CMP process.

9. The process of claim 1, further comprising removing the resist layer before forming a code mask layer over the substrate.

10. The process of claim 1, wherein a material for forming the code mask layer includes silicon oxide or resist.

11. A code implantation process for a mask read only memory (MROM), comprising:

forming a buried bitline in a substrate;

forming a gate oxide layer on a surface of the substrate;

forming a wordline on the gate oxide layer and forming a cap layer on a top of the wordline, wherein a stop layer is formed between the wordline and the cap layer;

forming a dielectric layer over the substrate to cover the cap layer;

removing a portion of the dielectric layer until the cap layer is exposed;

forming a resist layer with a line/space pattern on the dielectric layer and the cap layer, wherein the line/space pattern has a first extending direction different to a second extending direction of the cap layer;

removing the cap layer not covered by the resist layer;

forming a code mask layer over the substrate; and performing an ion implantation step to implant dopants into a predetermined code channel region by using the code mask layer, the dielectric layer and the remained cap layer as a mask.

12. The process of claim 11, wherein the stop layer and the cap layer have an etching selectivity.

13. The process of claim 11, wherein the dielectric layer and the cap layer have an etching selectivity.

14. The process of claim 11, wherein a material of the wordline is the same as that of the cap layer.

15. The process of claim 11, wherein a material of the wordline is different to that of the cap layer.

16. The process of claim 11, wherein a material for forming the wordline includes polysilicon.

17. The process of claim 11, wherein a material of the cap layer includes polysilicon, while a material of the stop layer is silicon nitride or silicon oxynitride and a material of the dielectric layer is silicon oxide.

18. The process of claim 11, wherein a material of the cap layer includes polysilicon, while a material of the stop layer is silicon oxide and a material of the dielectric layer is silicon nitride or silicon oxynitride.

19. The process of claim 11, wherein the first extending direction of the line/space pattern is perpendicular to the second extending direction of the cap layer.

20. The process of claim 11, wherein a method for removing a portion of the dielectric layer until the cap layer being exposed is an etching back process or a CMP process.

21. The process of claim 11, further comprising removing the resist layer before forming a code mask layer over the substrate.

22. The process of claim 11, wherein a material for forming the code layer includes silicon oxide or resist.

23. The process of claim 11, wherein forming the wordline, the stop layer and the cap layer further comprises:

forming a conductive layer on the gate oxide layer;

forming an etching stop layer on the conductive layer;

forming a material layer on the etching stop layer; and patterning the conductive layer, the etching stop layer and the material layer in a direction perpendicular to the buried bitline, to form the wordline, the stop layer and the cap layer on the top of the wordline.

* * * * *